(12) United States Patent
Smida et al.

(10) Patent No.: US 11,356,235 B2
(45) Date of Patent: Jun. 7, 2022

(54) SELF-INTERFERENCE CANCELLATION FOR IN-BAND FULL DUPLEX SINGLE ANTENNA COMMUNICATION SYSTEMS

(71) Applicant: THE BOARD OF TRUSTEES OF THE UNIVERSITY OF ILLINOIS, Urbana, IL (US)

(72) Inventors: Besma Smida, Chicago, IL (US); Danilo Erricolo, Chicago, IL (US); Seiran Khaledian, Chicago, IL (US); Farhad Farzami, Chicago, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 203 days.

(21) Appl. No.: 16/616,192

(22) PCT Filed: May 24, 2018

(86) PCT No.: PCT/US2018/034494
§ 371 (c)(1),
(2) Date: Nov. 22, 2019

(87) PCT Pub. No.: WO2018/218089
PCT Pub. Date: Nov. 29, 2018

(65) Prior Publication Data
US 2020/0099504 A1    Mar. 26, 2020

Related U.S. Application Data

(60) Provisional application No. 62/510,539, filed on May 24, 2017.

(51) Int. Cl.
*H04L 5/14* (2006.01)
*H01P 1/38* (2006.01)
(Continued)

(52) U.S. Cl.
CPC .............. *H04L 5/1461* (2013.01); *H01P 1/38* (2013.01); *H03H 11/28* (2013.01); *H04B 1/525* (2013.01); *H04B 1/58* (2013.01)

(58) Field of Classification Search
CPC ......... H04L 5/1461; H01P 1/38; H03H 11/28; H04B 1/525; H04B 1/58
See application file for complete search history.

(56) References Cited

U.S. PATENT DOCUMENTS

| | | | |
|---|---|---|---|
| 4,725,842 A * | 2/1988 | Mayberry | G01S 7/038 342/198 |
| 5,444,864 A | 8/1995 | Smith | |

(Continued)

FOREIGN PATENT DOCUMENTS

EP    2960672 A1 *  12/2015  ........... G01S 7/4017

OTHER PUBLICATIONS

International Search Report and Written Opinion from International Application No. PCT/US18/34494 dated Sep. 6, 2018.

*Primary Examiner* — Ayaz R Sheikh
*Assistant Examiner* — Tarell A Hampton
(74) *Attorney, Agent, or Firm* — Marshall, Gerstein & Borun LLP

(57) ABSTRACT

An analog self-interference cancellation technique for In-Band Full-Duplex (IBFD) systems generates an inherent secondary self-interference (SI) signal of a circulator and uses that signal to cancel a primary SI signal leaked from a transmitter port within a communication device. The communication device manipulates the phase and angle of this secondary SI, using an adjustable Impedance Mismatch Terminal (IMT) circuit. The result is an efficient SI cancellation technique in the analog domain, which uses the circulator inherent SI signals.

15 Claims, 14 Drawing Sheets

(51) Int. Cl.
  *H03H 11/28*   (2006.01)
  *H04B 1/525*   (2015.01)
  *H04B 1/58*    (2006.01)

(56) References Cited

U.S. PATENT DOCUMENTS

| | | | | |
|---|---|---|---|---|
| 6,507,728 B1 * | 1/2003 | Watanabe | | H04B 1/126 |
| | | | | 455/126 |
| 6,567,648 B1 * | 5/2003 | Ahn | | H04B 1/525 |
| | | | | 455/83 |
| 6,680,692 B2 * | 1/2004 | Solbach | | G01S 13/34 |
| | | | | 342/165 |
| 8,077,639 B2 * | 12/2011 | Knox | | H04L 12/66 |
| | | | | 370/278 |
| 9,071,337 B2 * | 6/2015 | Hellsten | | G01S 13/32 |
| 9,136,883 B1 * | 9/2015 | Moher | | H04B 1/0042 |
| 9,614,658 B2 * | 4/2017 | Moher | | H04B 1/406 |
| 9,780,437 B2 * | 10/2017 | Knox | | H04B 1/525 |
| 9,882,603 B2 * | 1/2018 | Wyville | | H04L 5/14 |
| 2014/0128008 A1 | 5/2014 | Cox et al. | | |
| 2016/0056846 A1 | 2/2016 | Moher et al. | | |
| 2016/0087698 A1 * | 3/2016 | Chang | | H04L 5/14 |
| | | | | 370/276 |
| 2016/0105272 A1 | 4/2016 | Griffiths et al. | | |
| 2016/0112078 A1 * | 4/2016 | Ju | | H02J 50/001 |
| | | | | 370/278 |
| 2016/0173164 A1 * | 6/2016 | Kim | | H04B 1/44 |
| | | | | 370/278 |
| 2016/0285486 A1 * | 9/2016 | Qin | | H04B 17/345 |
| 2016/0329982 A1 | 11/2016 | Lim et al. | | |
| 2016/0380799 A1 * | 12/2016 | Chang | | H04L 5/14 |
| | | | | 370/278 |
| 2017/0026022 A1 * | 1/2017 | Craninckx | | H03H 7/463 |
| 2017/0054224 A1 * | 2/2017 | Dine | | H01Q 1/38 |
| 2018/0006795 A1 * | 1/2018 | Raaf | | H04B 1/44 |
| 2018/0120390 A1 * | 5/2018 | Babakhani | | G01R 33/36 |
| 2018/0358997 A1 * | 12/2018 | Shekhar | | H04B 1/56 |

* cited by examiner

SELF-INTERFERENCE CANCELLATION FOR IN-BAND FULL DUPLEX SINGLE ANTENNA COMMUNICATION SYSTEMS

CROSS-REFERENCE TO RELATED APPLICATIONS

This application claims the priority benefit under 35 U.S.C. § 119(e) of U.S. Provisional Patent Application No. 62/510,539, entitled, "Self-Interference Cancellation For In-Band Full Duplex Single Antenna Communication Systems," filed May 24, 2017, the disclosure of which is incorporated herein by reference in its entirety.

STATEMENT OF GOVERNMENTAL INTEREST

This invention was made with government support under Grant No. 1620902 awarded by the National Science Foundation. The government has certain rights in this invention.

FIELD OF THE INVENTION

The present disclosure relates generally to cancellation of the interference between transmitted and received signals in an antenna and, more particularly, to a single antenna In-Band Full Duplex device that allows the same frequency band to be used simultaneously for both sending and receiving signals due to transmitter and receiver self-interference cancellation.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

In a typical communication system, there is a transmitter, TX, and a receiver, RX, that exchange information by means of electromagnetic waves. The electromagnetic waves sent by TX towards RX occupy a portion of the electromagnetic spectrum, B_TX, which is different from the portion of the electromagnetic spectrum, B_RX, used by RX to send electromagnetic waves toward TX. The reason why B_TX and B_RX are different and cannot overlap is to avoid interference between the electromagnetic waves sent from a TX to a RX and those sent from the RX back to the TX. As a result, if a bandwidth B is needed to exchange information between TX and RX, current technological implementations use on two separate portions of the electromagnetic spectrum for a total spectrum usage of 2B. The TX and RX can also use the same electromagnetic spectrum at different time slots to avoid self-interference. The time needed to exchange the information will then double. Resulting in reduced spectrum efficiency.

Unlike the foregoing, with In-Band Full-Duplex (IBFD) communications, nodes are able to transmit and receive simultaneously in the same frequency band. IBFD communications have the potential of doubling the spectrum efficiency of communication systems as well as improving fairness and network latency.

However, IBFD systems suffer from strong Self-Interference (SI) signals that are imposed on the received signal by the transmitted signal. Thus, a main challenge that IBFD systems confront is reducing SI signals. The amount of SI cancellation value for efficient IBFD communication depends on the transmitted signal power and on the noise floor at the receiver. The SI signal level should be reduced to the same level as the receiver noise floor. The main obstacle to cancelling out SI signals lies, however, in the fact that one does not know the SI signal with precision. Instead, designers know the base-band (digital) TX signal. As the TX signal is sent through the Digital to Analog Converter (DAC), up-convert mixer and power amplifier, there can be harmonics, linear and nonlinear distortions, extra noise and frequency selective delays that are imposed on the TX signal, making a transmitted TX signal quite different from the base-band TX signal.

To date, many have proposed different SI cancellation techniques; and recently the feasibility of a practical IBFD system has been proved. Generally speaking, SI cancellation can be accomplished in three stages: passive cancellation, digital cancellation, and analog (RF) cancellation. A passive cancellation stage uses electromagnetic isolation between TX and RX antennas. This method includes physical separation of antennas, directional isolation of antennas, absorptive shielding, cross-polarization, using band-gap structures, inductive loops, wave traps and slots on the ground plane. In a digital cancellation stage, the base-band TX signal is subtracted from the received signal all in digital domain. Digital cancellation has to be applied along with analog cancellation to achieve an efficient SI cancellation. In an analog SI cancellation stage, a sample of a TX signal with all transmitter impairments is tapped and modified through an estimator circuit to create a replica of SI signal. This modified TX sample is called a cancellation signal and can be removed from the received signal to cancel out SI signal.

Many techniques use multiple antennas (at least one RX and one TX antenna). Using separate antennas significantly increases SI cancellation, but it has two main drawbacks. First, using multiple antennas prevents the dense integration of IBFD systems due to the required physical distance of the antennas. In other words, it does not satisfy the desired form-factor of most of today's wireless communication systems. Second, multiple antenna configurations can be used in spatial duplexing system design rather than solving the duplexing problem in the frequency or time domains as with IBFD systems.

Fewer designers have studied single-antenna IBFD systems compared to multiple antennas configurations. Initial first single-antenna IBFD configurations used two lumped-element circulators and two 3 dB quadrature hybrids to reduce SI. The configuration achieved up to 40 dB isolation between TX and RX channels over 25 MHz bandwidth in the 900 MHz frequency band. Unfortunately, the configuration was quite costly, because it required two RF circulators and the lumped-element microwave components were hard to implement at higher frequencies, due to low quality factor of inductors and capacitors. Recently, some have proposed using a complex analog SI cancellation circuit including multiple delay lines, tunable attenuator along with adaptive algorithm. But such a design is not practical in small cellular devices. In another design, an electrical balance duplexer was used to achieve high SI cancellation in single-antenna IBFD systems. In this technique, however, there is a large TX insertion loss (half of the TX power is lost). In another design, a simultaneous transmit and receive antenna (STAR) with two arm pairs (one pair as TX and one pair as RX antennas) in one platform were proposed. A 37 dB isolation between RX and TX channels was achieved by using two 3 dB 180° hybrids. However, the achieved isolation solution was limited to the proposed four-arms antenna and cannot be used in arbitrary IBFD systems with arbitrary antenna. In yet another design, a dual-polarized antenna was used. Up to 60 dB and 47 dB isolation between TX and RX waves was achieved, respectively. However, using two orthogonal polarizations for transmission and reception is not practical for mobile communications.

SUMMARY

The present application describes analog self-interference cancellation (SIC) techniques for In-Band Full-Duplex (IBFD) single-antenna systems. The techniques are collectively referred to herein as "inherent SIC" techniques.

The present techniques apply an inherent secondary SI signal at a circulator, reflected by an antenna, to cancel a primary SI signal leaked from the transmitter (TX) port. This self-interference cancellation provides considerable advantages over conventional techniques estimating the self-interference (SI) signal and subtracting it from the receiver (RX) signal. With the present techniques, the magnitude and phase of a secondary SI signal may be modified using an adjustable impedance mismatch terminal (IMT) circuit at the antenna port.

In example implementations, the IMT circuit may be formed of two varactor diodes that are robust to antenna input impedance variations and fabrication errors.

In example operations, the frequency band and bandwidth may be adjusted by applying various voltage DC biases to the varactor diodes. As detailed below, the results have been validated through analyzing the performance of a prototype using Advance Design System (ADS). In an example implementation, we measured up to 90 dB cancellation for narrowband systems and 40 dB for wideband systems (over 65 MHz bandwidth) at 2.45 GHz, using an inherent SIC approach.

The inherent SIC approaches herein are particularly useful in small mobile devices because they provide low-power and low-cost adjustable analog SI cancellation.

In example implementations, the present techniques decrease by a factor of 2 the frequency spectrum bandwidth needed for a communication link, i.e., compared to existing standard communication systems. Equivalently, in such implementations, double the number of communication links that can exist in a given frequency spectrum bandwidth compared to standard communication technology. Alternatively, for the same amount of frequency spectrum already used, the amount of information that is exchanged can be doubled. That is, the present techniques remove the challenge due to the interference of the signals associated with different electromagnetic waves in the same frequency band and at the same antenna location. Further still, in example implementations interference is removed in an analog way (as opposed to a digital way) by using a circulator and taking advantage of the second inherent self-interference signal to cancel the primary inherent self-interference signal.

The present techniques are thus capable of doubling (at least) the capacity of the electromagnetic spectrum currently used for communication systems. Indeed, another advantage is that the present techniques are able to directly impact other systems, beyond communication systems.

On a hardware level, there are advantages with respect to competing solutions, because the present techniques use a secondary inherent SI signal as a cancellation signal and the circulator as combiner. Therefore, RF combiners, RF attenuators, and RF phase shifters are not needed, which reduces complexity and costs considerably. By implementing in hardware, there is the additional advantage of being low profile and the ability to straightforwardly implement on existing cellular phone devices. The techniques are also robust to antenna input impedance variation and can compensate for fabrication errors and component frequency response deviations by tuning the varactor diodes DC voltage biases. Indeed, we experimentally demonstrated that our design is capable of showing flexible performance depending on the application.

In an example, a method for self-interference cancellation in an In-Band Full-Duplex (IBFD) system, the method comprises: providing the IBFD system consisting of a single antenna and comprising a circulator having at least a transmitter port, a receiver port, and an impedance mismatch terminal (IMT) port, the IBFD system further comprising a transmitter connected to the transmitter port, a receiver connected to the receiver port, and an IMT circuit connected to the IMT port and operating between the antenna and the circulator; and configuring the IMT circuit to collect a secondary self-interference signal of the circulator and to manipulate the phase and angle of the secondary self-interference signal.

In another example, a single-antenna In-Band Full-Duplex system comprises: an antenna; a circulator having at least a transmitter port, a receiver port, and an impedance mismatch terminal (IMT) port; a transmitter connected to the transmitter port; a receiver connected to the receiver port; and an IMT circuit connected to the IMT port and operatively coupled between the antenna and the circulator; wherein the transmitter and receiver are configured to operate on the same wavelength; and wherein the IMT circuit is configured to modify the magnitude and phase of a secondary self-interference signal to cancel a primary self-interference signal leaked from the transmitter port.

In yet another example, a method for increasing usable capacity of an electromagnetic spectrum for a communication device, the method comprises: establishing a transmitting channel between a transmitter and a single antenna in an In-Band Full-Duplex system, the transmitting channel including a circulator operatively coupled to the transmitter and to the single antenna; establishing a receiving channel between a receiver and the single antenna, the receiving channel including the circulator, the circulator operatively coupled to the receiver; operating an impedance mismatch terminal (IMT) circuit between the circulator and the single antenna to collect a secondary self-interference signal of the circulator and to manipulate a phase and angle of the secondary self-interference signal to cancel at least a portion of a primary self-interference signal leaked from a transmitter port of the transmitter, wherein cancellation of the at least a portion of the primary self-interference signal increases the usable capacity of the electromagnetic spectrum of the In-Band Full-Duplex system.

BRIEF DESCRIPTION OF THE FIGURES

The figures described below depict various aspects of the system and methods disclosed therein. It should be understood that each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

DETAILED DESCRIPTION

The present application describes analog self-interference cancellation (SIC) techniques for In-Band Full-Duplex (IBFD) systems, techniques that can be implemented on IBFD systems using a single-antenna. The techniques are also referred to herein collectively as "inherent SIC" techniques.

The present techniques generate an inherent secondary self-interference (SI) signal of a circulator that is then used to cancel a primary SI signal leaked from a transmitter port within a communication device. The communication device manipulates the phase and angle of this secondary SI, for example, using a fixed or an adjustable impedance mismatch terminal (IMT) circuit. The result is an efficient SI cancellation technique in the analog domain, which uses the circulator inherent SI signals. The techniques decrease the complexity, cost, and power consumption of SI cancellation circuitry, by eliminating many RF components (sampler, combiner, attenuator and phase shifter). Furthermore, by we have developed adjustable IMT circuit designs that increase the robustness to the antenna input against impedance variations, component deviations, and fabrication errors.

Figure 1:
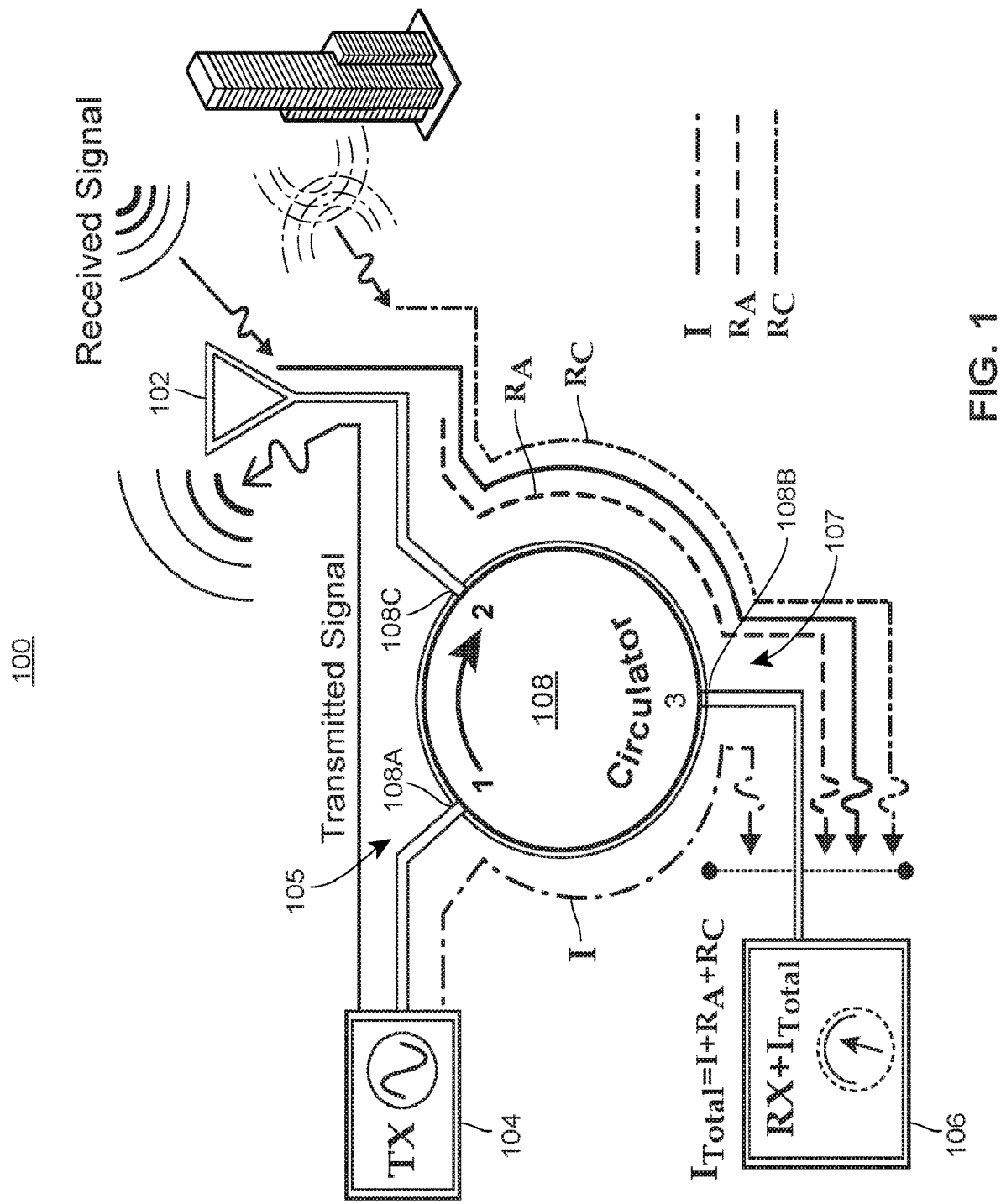
FIG. 1 is a signal diagram for a conventional half-duplex antenna.

FIG. 1 is a signal diagram of a half-duplex communication system 100 with a conventional configuration. The half-duplex communication system 100 has a single antenna 102. The system 100 includes a transmitter 104 coupled to the antenna 102 through a circulator 108 and configured to transmit a transmitted signal along a TX channel 105. The system 100 further includes a receiver 106 coupled to the antenna 102 though the circulator and configured to receive a received signal on an RX channel 107.

The communication system 100 is describe as if used in a in-band full duplex configuration capable of cancelling out strong transmitter (TX) interference imposed on the receiver (RX) channel 107. Contrary to the analog cancellation techniques in conventional systems, the communication system 100 does not tap from the TX channel 105 to generate a cancellation signal. Instead, a secondary inherent self-interference (SI) signal ($R_A$) is generated to cancel out the primary inherent SI signal (I). By using the inherent signal rotation path property of the circulator 108, circuit elements like an RF combiner, an RF attenuator, and an RF phase shifter can be avoided. This configuration also reduces the complexity and cost of digital attenuators and phase shifters control unit, because two analog voltages can be used to control the entire communication system 100.

In the communication system 100, only the single antenna 102 is used for transmission and reception. The single antenna 102, like the other single antenna configurations described herein, is an example of a single input antenna. The antenna 102 may represent any single input antenna, including a single input array antenna. The TX channel 105 and the RX channel 10 are separated through the circulator 108. Port 108A (also labeled port 1) of the circulator 108 is connected to the TX channel 105 and port 108A (also labeled port 3) is connected to the RX channel 107. Port 108C (also labeled port 2) is connected to the antenna 102. Practically speaking, circulators do not provide perfect isolation between their ports. Thus, a TX signal leaks to the RX channel 107, causing a primary inherent self-interference (SI) signal, illustrated by I in FIG. 1. A secondary inherent SI signal, $R_A$, results from the TX signal reflected at the antenna 102 due to inherent impedance mismatch, where that secondary inherent SI signal is added to the RX channel 107 through the circulator. Another SI signal shown by $R_C$ at FIG. 1 is due to environmental scattering.

These interference signals have different amplitudes and phases, depending on the circuit and the environment parameters. However, generally I and $R_A$ have the highest power because they don't experience path-loss. As shown in FIG. 1, the desired received signal RX, can be combined with major SI signals I, $R_A$, and $R_C$ at the receiver 106. Due to the free space path loss, the received signal RX is significantly weaker than the SI signals, often making it impossible for the receiver 106 to accurate extract the received signal. Thus, the interference signals must be effectively suppressed at the receiver 106.

Conventionally, at an analog cancellation stage, one attempts to suppress SI signals I and $R_A$. $R_C$ is usually canceled at the digital cancellation stage using pilot sequences and tones. The common analog cancellation technique is to tap the TX signal, modify its amplitude and phase responses, and then add it to the RX channel. The modified TX sample is called a cancellation signal (C). The cancellation signal has the same amplitude, but 180° phase shift compared to the SI signals. In other words, the cancellation signal cancels out SI signals (RA and I) to have RX+I+$R_A$ C=RX at the receiver. There are different algorithms and techniques to implement this concept, and different values of achieved analog SI cancellation have been reported, but essentially conventional techniques work this way.

With the present techniques, however, a new analog SI cancellation technique is implemented, one that uses the SI signal of $R_A$ as the cancellation signal instead of sampling from the TX channel as with previous work. The present techniques take advantage of the reflected TX signal at the antenna interface. That is, in reference to FIG. 1, the signal $R_A$ is captured, and the amplitude and phase of RA is modified to cancel out I at the receiver 106.

Figure 2:
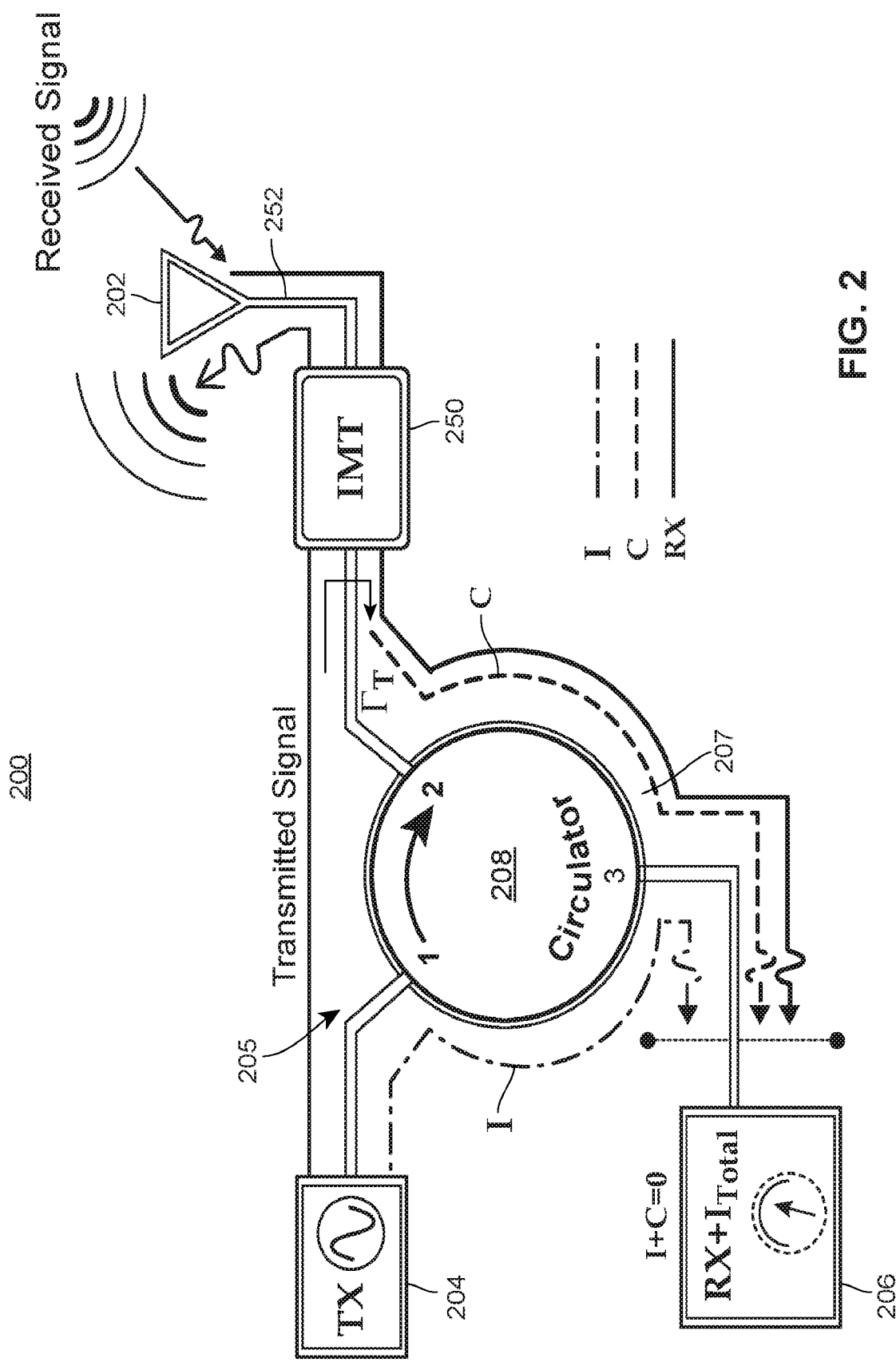
FIG. 2 is a signal diagram for an example of a single-antenna In-Band Full-Duplex (IBFD) antenna system integrated with an impedance mismatch terminal (IMT) circuit, in accordance with an example of the present techniques.

An example IBFD communication system 200 that overcomes the deficiencies of existing systems is shown in FIG. 2. The IBFD system 200 provides a capture and modification process achieved using an adjustable IMT circuit 250 positioned at an antenna interface 252 of an antenna 202 to manipulate the amplitude and phase of $R_A$. The IMT circuit 250 represents any number of impedance mismatch devices capable of tapping a signal, modifying the amplitude and phase of that tapped signal, and generating a modified version having a desired amplitude and phase shift. Such devices may be adjustable, e.g., through an electrically coupled controller, or such devices may be non-adjustable, e.g., tuned to desired operation, and having fixed circuit elements.

The IBFD system 200 is similar in other respects to the half-duplex system 100 shown in FIG. 1 and includes a transmitter 204 defining, with the antenna, a TX channel 205 and a receiver 206 defining an RX channel, with the antenna. Further, a circulator 208 is shown coupling each of the transmitter 204 and receiver 206 with the antenna 202. In the IBFD system 200, the amplitude and phase of a cancellation signal is modified through the reflection coefficient seen by the IMT circuit 250, that is the reflection coefficient ($\Gamma_T$). Thus, the IMT circuit 250 is an impedance matching circuit which provides the desired $\Gamma_T$.

The cancellation signal captured and adjusted by the IMT circuit 250 is then added to the RX channel 207 using the circulator 208 that has been used to separate the RX channel 207 and TX channel 205.

A number of techniques may be used to determine the amplitude and phase of the $\Gamma_T$ capable of providing the proper cancellation signal.

Figure 3:
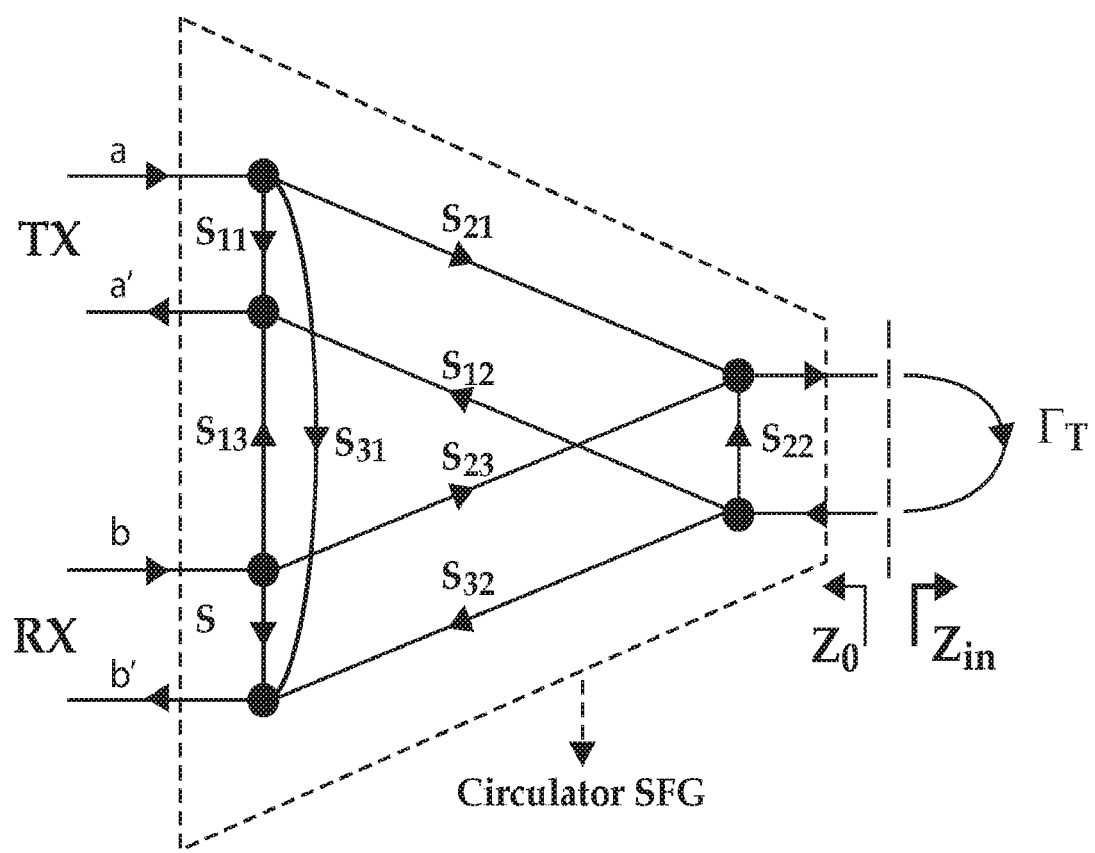
FIG. 3 is a signal-flow graph for the IBFD system of FIG. 2, in accordance with an example.

In an example implementation, the Signal-Flow Graph (SFG) of the IBFD system 200, illustrated in FIG. 3, may be used to derive $\Gamma_T$. The circulator SFG is illustrated considering the reflection coefficient, insertion loss, and isolation at each port. S11, S22, and S33 representing the return loss of ports 1, 2, and 3 of the circulator 208, respectively. S21, S32, and S13 represent the insertion losses from port 1 to 2, port 2 to 3 and port 3 to 1 of the circulator 208, respectively. S12, S31, and S23 represent isolation between port 1 and 3, port 1 and 2, and port 2 and 3 of the circulator 208, respectively. $Z_{in}$ is the input impedance seen by a circulator-side interface 254 of the IMT circuit 250; and a and a' represent the incident and reflected TX signals, respectively; while b and b' represent the incident and reflected RX signals, respectively. The value of b'/a defines the amount of signal a (TX) that leaks to the RX port 3 due to circulator leakage and $\Gamma_T$. The derivation of b'/a is carried out using the Mason rule as follows:

$$\frac{b'}{a} = \frac{S_{31}(1 - \Gamma_T S_{22}) + S_{21}\Gamma_T S_{32}}{1 - \Gamma_T S_{22}} \quad (1)$$

Now the required $\Gamma_T$ can be determined by setting Eq. (1) equal to zero, resulting in:

$$\Gamma_T = \frac{S_{31}}{S_{31}S_{22} - S_{21}S_{32}} \quad (2)$$

From the definition of the reflection coefficient, we have:

$$Z_{in} = \frac{Z_0 + \Gamma_T Z_0}{1 - \Gamma_T} \quad (3)$$

where $Z_0$ is the input impedance (characteristic impedance) of the circulator seen at the port 2. The IMT circuit is an impedance matching circuit which transfers the antenna input impedance to $Z_{in}$. Since $|\Gamma_T| \ll 1$, transmission and reception losses are negligible.

In this example, we also determined the IMT configuration that delivers the desired $Z_{in}$ may be determined. The value of $Z_{in}$ was determined using Eq. (2) and (3). However, when it comes to the antenna, the following additional considerations appear:

a) different types of antenna show different values of input impedance,
b) even for a specific antenna, the input impedance varies within its frequency bandwidth, and
c) the input impedance can be changed slightly due to the fabrication errors or mounting place.

The adjustable IMT circuit 250, however, is able to compensate for the antenna input impedance variation and for the fabrication errors and for other RF components frequency response deviations. In an example, the IMT circuit 250 was implemented using an impedance matching circuit with two degrees of freedom as follows:

a) a variable series capacitance, and
b) a variable shunt capacitance.

That is, an IMT circuit with these two degrees of freedom can match the antenna input impedance and tune potential circuit component frequency response deviations to the desired $Z_{in}$.

In an example implementation of the IMT circuit 250, varactor diodes were used to achieve variable capacitance.

Figure 4:
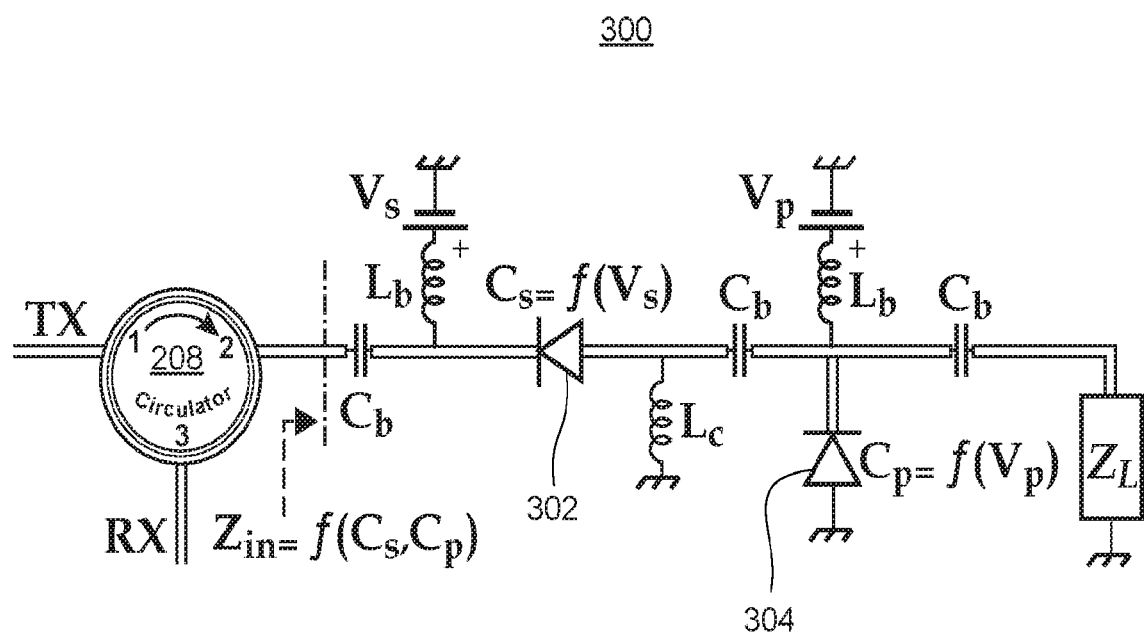
FIG. 4 is a schematic diagram of an example tunable IMT circuit with parallel and series varactor diodes, in accordance with an example.

In FIG. 4, a configuration 300 of an example implementation of the IMT circuit 250 is shown having two varactor diodes 302 and 304. The varactor diode 302 is configured in series with the circulator 208, and the varactor diode 304 is configured in parallel with the circulator 208. In FIG. 4, $Z_1$ represents the input impedance of the antenna 202; and $C_P$ and $C_S$ are the parallel and series variable capacitance realized by varactor diodes 304 and 302, respectively. $V_S$ and $V_P$ are DC voltage biases of the series and parallel varactor diodes 302 and 304, respectively. Varactor diode capacitance is a function of its DC bias voltage, $C_S = f(V_S)$ and $C_P = f(V_P)$. Since the input impedance of the IMT circuit 250 is a function of $C_S$ and $C_P$, we can tune $Z_{in}$ via $V_S$ and $V_P$. The inductor $L_C$ is connected to the ground to close the DC current path of the series varactor. This configuration 300 allows the building of a single-antenna IBFD system at 2.45 GHz.

The two varactor example of FIG. 4 is an example of a self-adjustable IMT configuration. It will appreciated that the IMT circuit 250 may be implemented in any number of ways, including using adjustable and non-adjustable circuit elements, such as diodes, etc.

An example implementation is now discussed.

Example: Components for a Single-Antenna IBFD System Operating at 2.45 GHZ

A single-antenna IBFD system in accordance with teachings herein was built to operate at the 2.45 GHz frequency band. The example included an antenna, an IMT circuit, and a circulator in a configuration like that of FIG. 2. Each part was analyzed separately.

Figure 5:
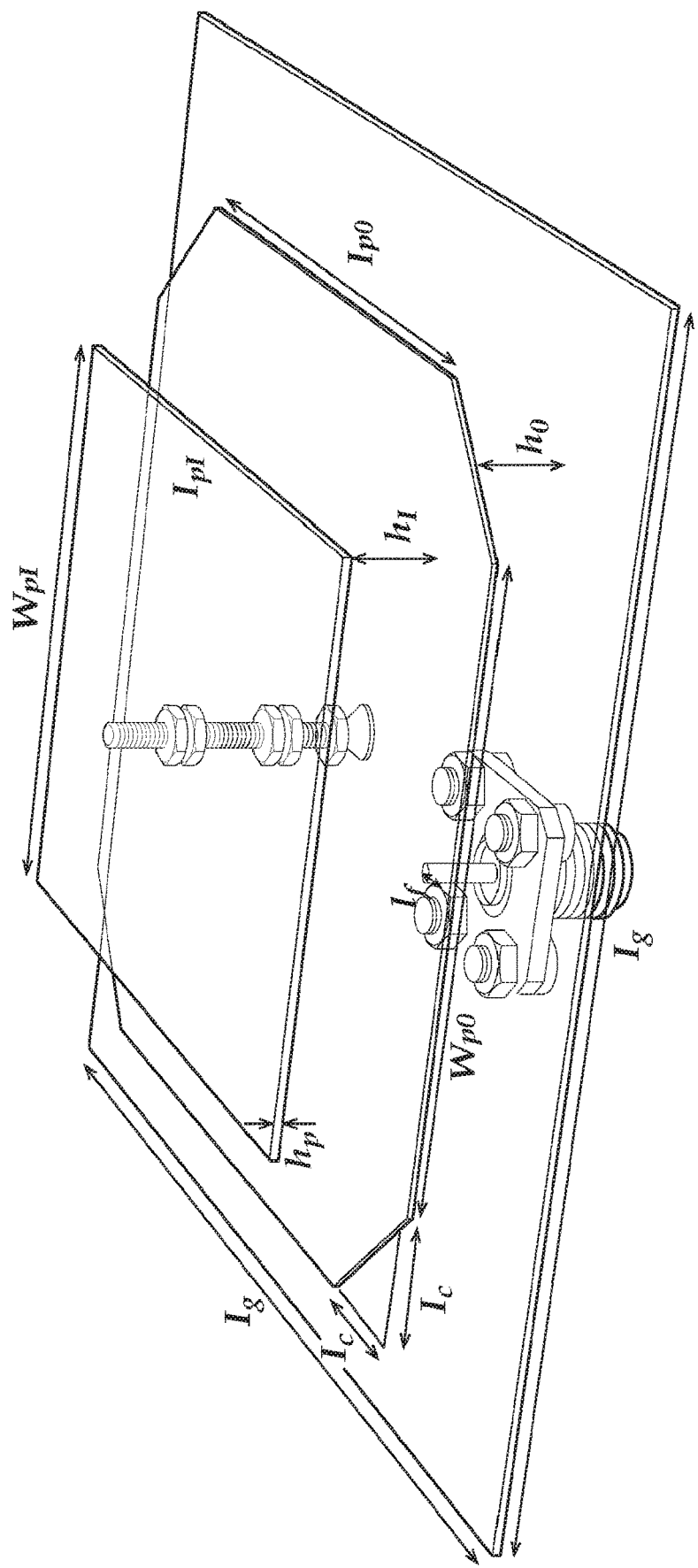
FIG. 5 illustrates an example an air-filled stacked patch antenna layout, in accordance with an example.
Figure 6:
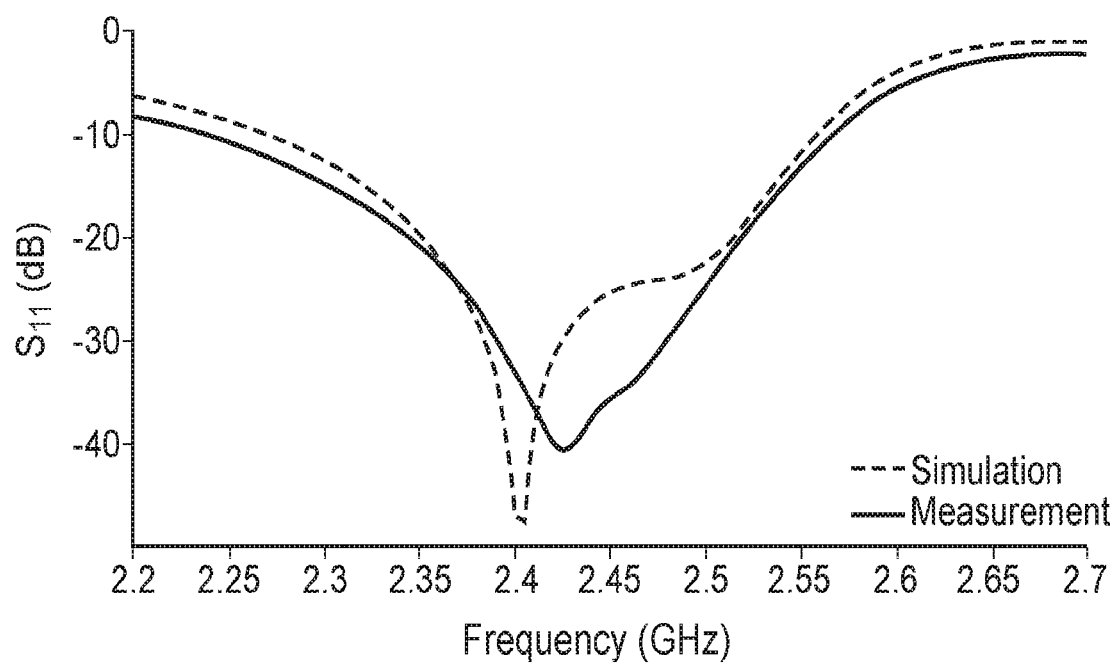
FIG. 6 is a plot of the simulated and actual return loss of port 1 of the air field stacked patch antenna of FIG. 5, in accordance with an example.

The antenna: We used an air-filled stacked patch antenna, which show good matching bandwidth and are straightforward to design. These types of antenna also provide a successful model in Wi-Fi transmitters. FIG. 5 illustrates a layout of air-filled stacked patch antenna for operation at 2.45 GHz. The dimensions for this particular example antenna in mm were: $L_g=120$, $W_{p0}=44$, $L_{p0}=43.5$, $W_{p1}=40.5$, $L_0=49$, $h_0=4.6$, $h_1=6.5$, $h_p=0.508$, $L_c=5$, $I_f=4.5$. The simulation resulted from HFSS and S11 measurements of the antenna are shown in FIG. 6.

Figure 7:
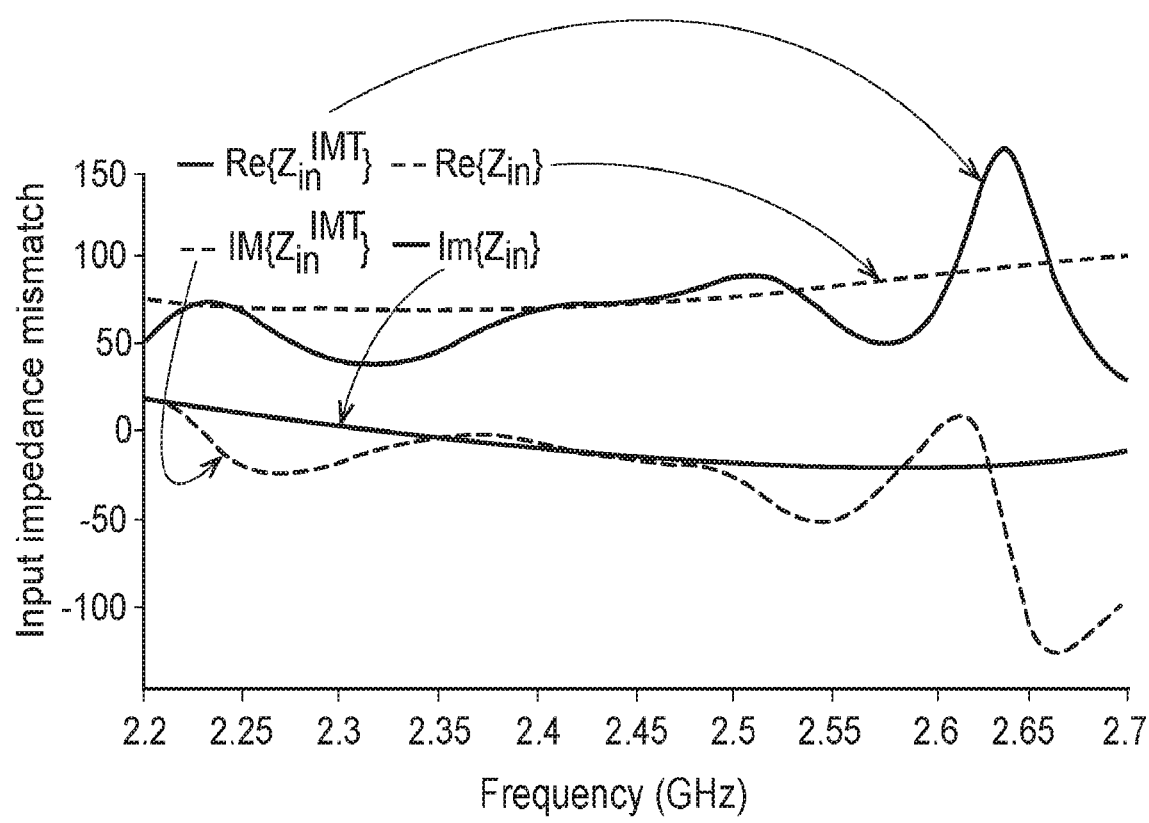
FIG. 7 is a plot of the real and imaginary parts of the input impedance seen by the IMT circuit interface, in accordance with an example.

2) The circulator: We used a circulator from RF Circulator Isolator of San Jose, Calif., circulator number CR5358. The S-parameters for the circulator were extracted and substituted in Eq. (2) and (3) to derive $Z_{in}$. FIG. 7 shows $Z_{in}$ in terms of its real and imaginary parts ($Re(Z_{in})$, $Im(Z_{in})$), versus frequency.

Figure 8:
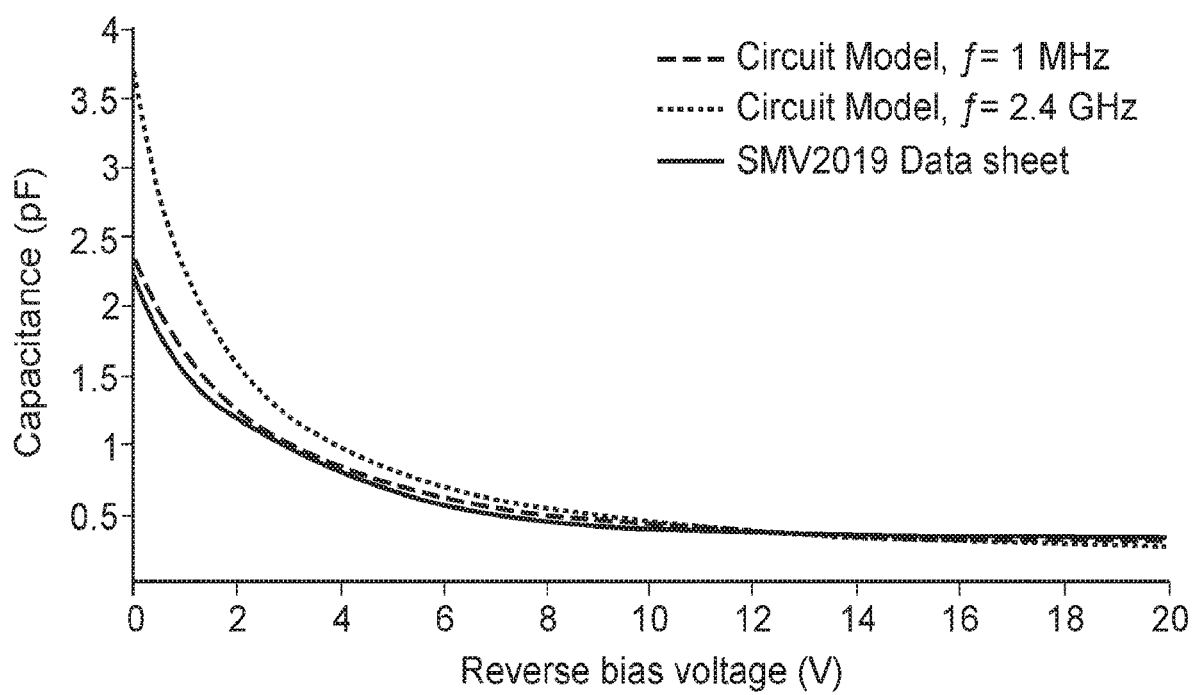
FIG. 8 illustrates the capacitance values of the varactor, in accordance with an example.
Figure 9:
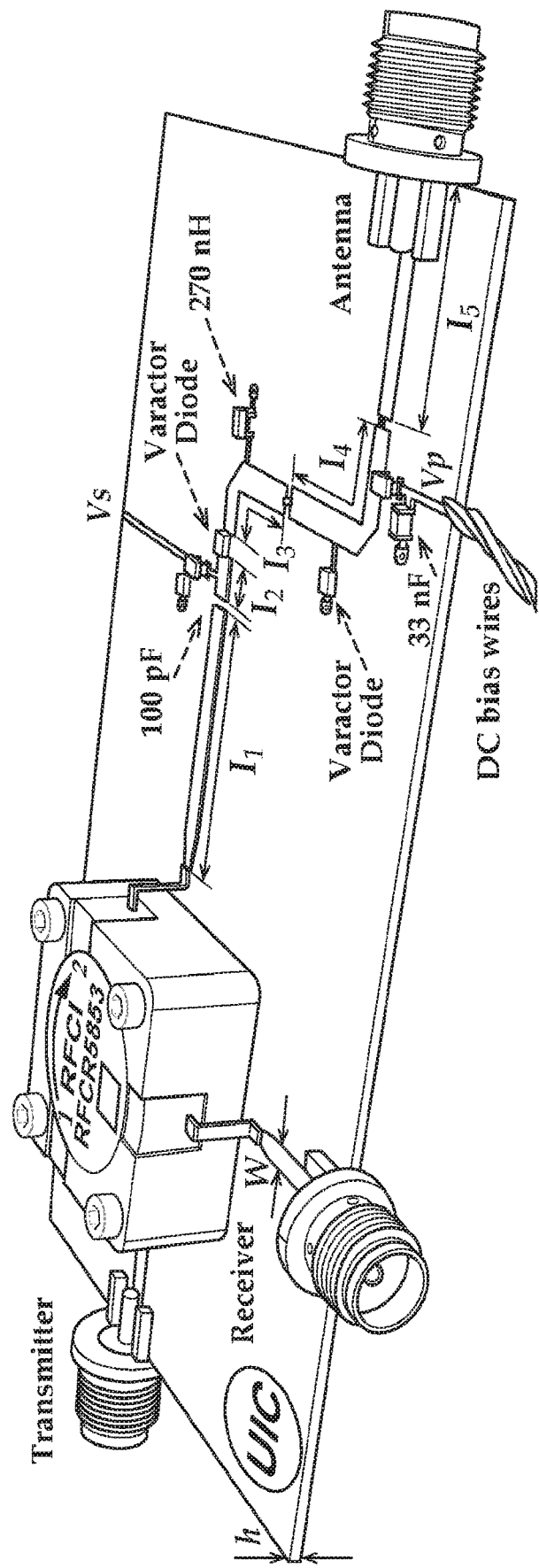
FIG. 9 illustrates an example of the IMT circuit layout connected to a circulator, in accordance with an example.

3) The tunable IMT circuit: The IMT circuit configured to operate at 2.45 GHz is shown in FIG. 9. For the layout in FIG. 9, the parameter values in mm were: $I_1=19$, $I_2=2.7$, $I_3=9.5$, $I_4=15$, $I_5=12.5$, $W=1.8$, and $h=0.812$. Varactor diodes were chosen to have small insertion loss and proper capacitance range. We used the SMV2019 varactor diode from Skyworks Inc. of Woburn, Mass., for both the series and parallel variable capacitance. FIG. 8 shows the capacitance value versus the applied reverse bias voltage. The varactor diode capacitance value shows a slightly dispersive frequency response. The provided circuit model by Skyworks was used for the circuit simulation.

The example tunable IMT circuit layout is shown in FIG. 9. The substrate was the R04003C substrate from Rogers Corporation of Bear, Del., with $\epsilon_r=3.55$ and $h=32$ mil (0.8128 mm). DC bias capacitors from Murata Manufacturing of Japan were used, and inductors from Coilcraft of Cary, Ill. were used. The IMT circuit included a microstrip transmission line with two varactor diodes in series and parallel configuration. The DC bias lines fed the varactor diodes and were separated from the RF signal by proper high impedance inductors. A meander line was used to keep the circuit low profile.

We used an Advanced Design System (ADS) simulator from Keysight Technologies of Santa Rosa, Calif. to analyze the IMT circuit and carry out the simulation. To improve the simulation accuracy, an electromagnetic (EM) cosimulator of ADS was used. The DC bias voltages of the varactor diodes were chosen in the middle of their capacitance range for tuning purpose.

Example: Simulation and Measurement Results

Figure 10:
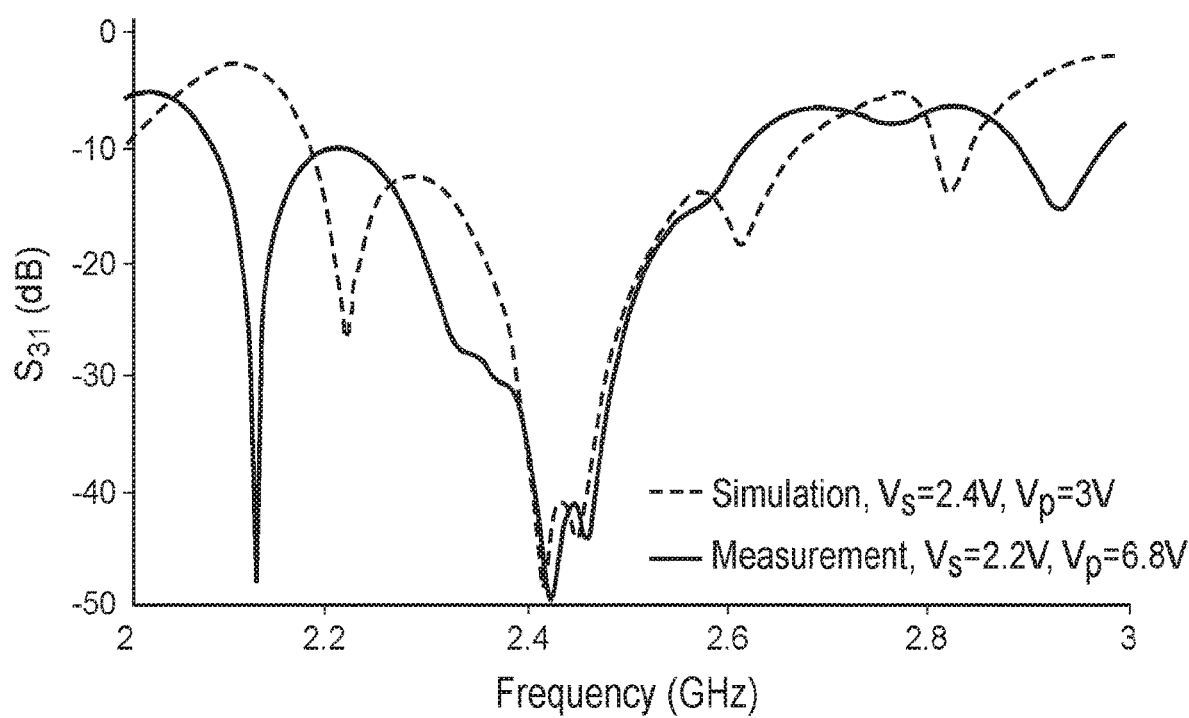
FIG. 10 is a graph of wideband analog SI cancellation simulation and measured performance, in accordance with an example.

We evaluate the performance of the single-antenna IBFD system by measuring the achieved SI cancellation. The amount of TX signal leaked to the receiver (S31) was measured using a N5222A PNA Vector Network Analyzer available from Agilent Technologies of Santa Clara, Calif. However, because input impedance of an IMT circuit is a function of DC voltage biases of varactor diodes, inherent SIC provides various SI cancellation values for different sets of $V_P$ and $V_S$. Therefore, based on the application, we set the DC biases to have a high amount of SI cancellation and/or a wideband spectrum SI cancellation. We also adjusted the operating frequency using $V_P$ and $V_S$. For example for $V_P=6.8V$ and $V_S=2.2V$, 40 dB analog SI cancellation over 60 MHz frequency bandwidth was achieved in 2.45 GHz frequency band, as shown in FIG. 10. As discussed earlier, the input impedance of the antenna connected to the IMT circuit ($Z_{in}^{IMT}$) should match $Z_{in}$ over the desired frequency bandwidth. As shown in FIG. 7, $Z_{in}^{IMT}$ for $V_P=6.8V$ and $V_S=2.2V$ follow $Z_{in}$ at 2.45 GHz, over 60 MHz frequency bandwidth.

Figure 11:
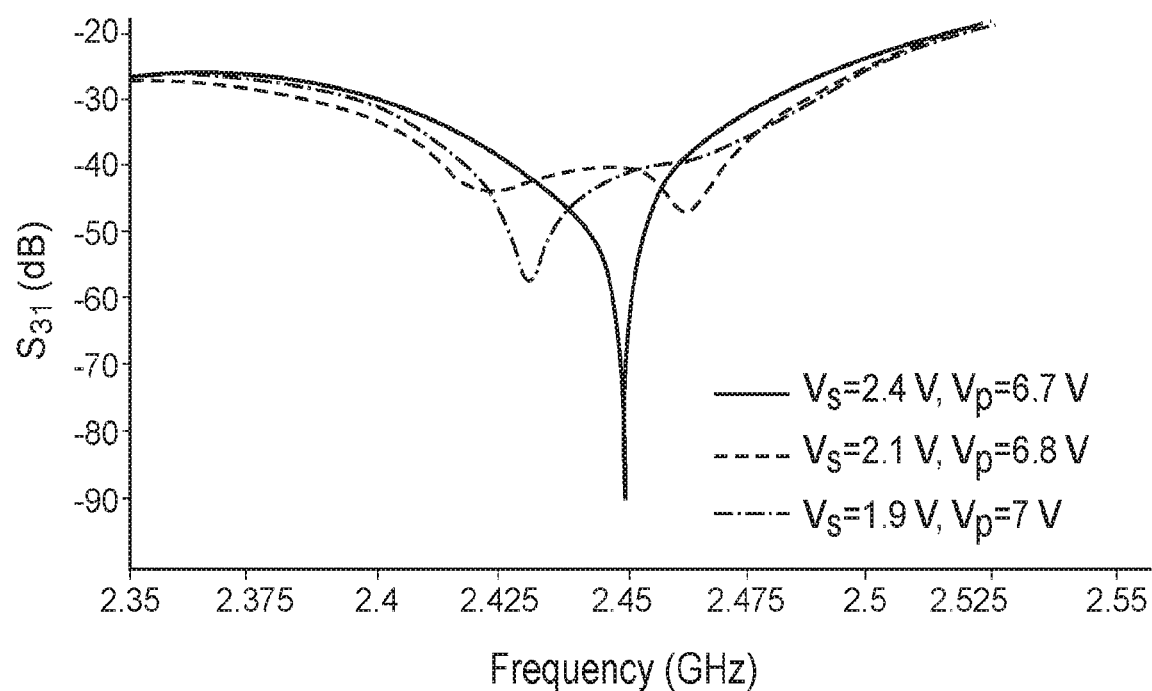
FIG. 11 is a graph of different measurements of achieved SI cancellation corresponding to different sets of varactor diodes, in accordance with an example.

The inherent SIC performance was measured for more DC voltage bias sets. FIG. 11 shows the achieved cancellation for extra three DC voltage bias sets. As shown in FIG. 11, up to 90 dB SI cancellation was achieved by $V_S=2$ V and $V_P=6.7$ V. A 65 MHz frequency bandwidth in 40 dB SI cancellation was achieved by $V_S=2.2$ V and $V_P=6.8$ V. We shifted the operation frequency from 2.45 GHz to 2.43 GHz using $V_S=1.9$ V and $V_P=7$ V. The measured results of FIG. 11 show that the final performance of the single antenna IBFD system can be controlled with $V_P$ and $V_S$. In an example, up to 90 dB cancellation is achieved in narrowband applications, while 60 MHz bandwidth is achieved in wideband applications in 2.45 GHz frequency band. The insertion loss was measured as 0.75 dB for both the TX to antenna path and the antenna to RX path, which is negligible compared to other analog cancellation techniques used in previous works, as discussed in the introduction.

Figure 12:
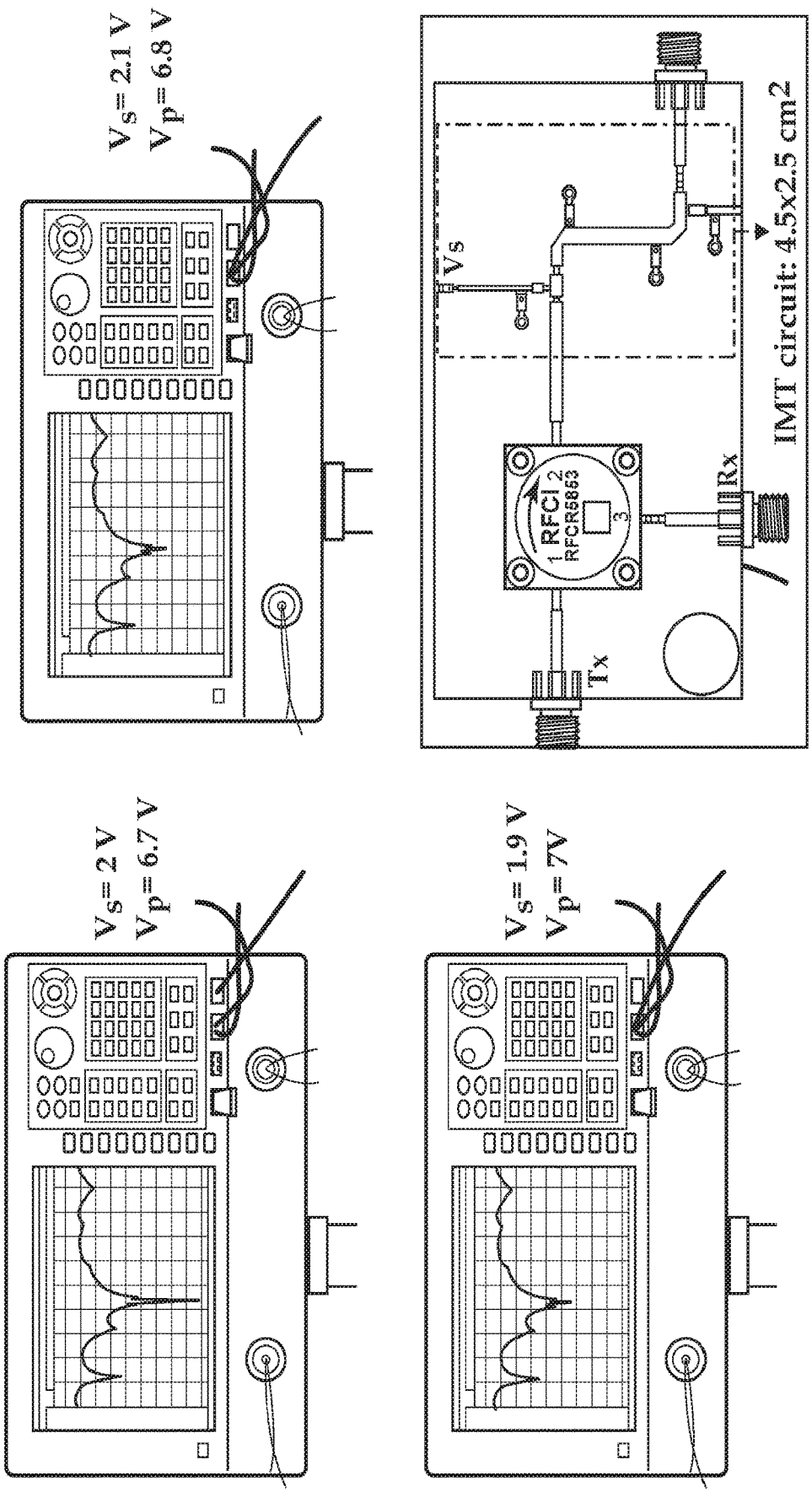
FIG. 12 illustrates an example a single-antenna IBFD system measurement setup for three different sets of Vp and Vs and fabricated IMT circuit connected to the circulator, in accordance with an example.

An example measurement setup and fabricated version of the IMT circuit are shown in FIG. 12. The total area of the IMT circuit was 4.5×2.5 cm²; and the maximum DC power consumption of each varactor diode, considering the maximum reverse current of 20 nA, is around 0.15 mW. The amount of SI cancellation achieved using this technique is enough to make sure that the RX channel is not saturated by TX signal. Furthermore, these techniques may be combined with a digital cancellation stage to form an IBFD system.

Figure 13:
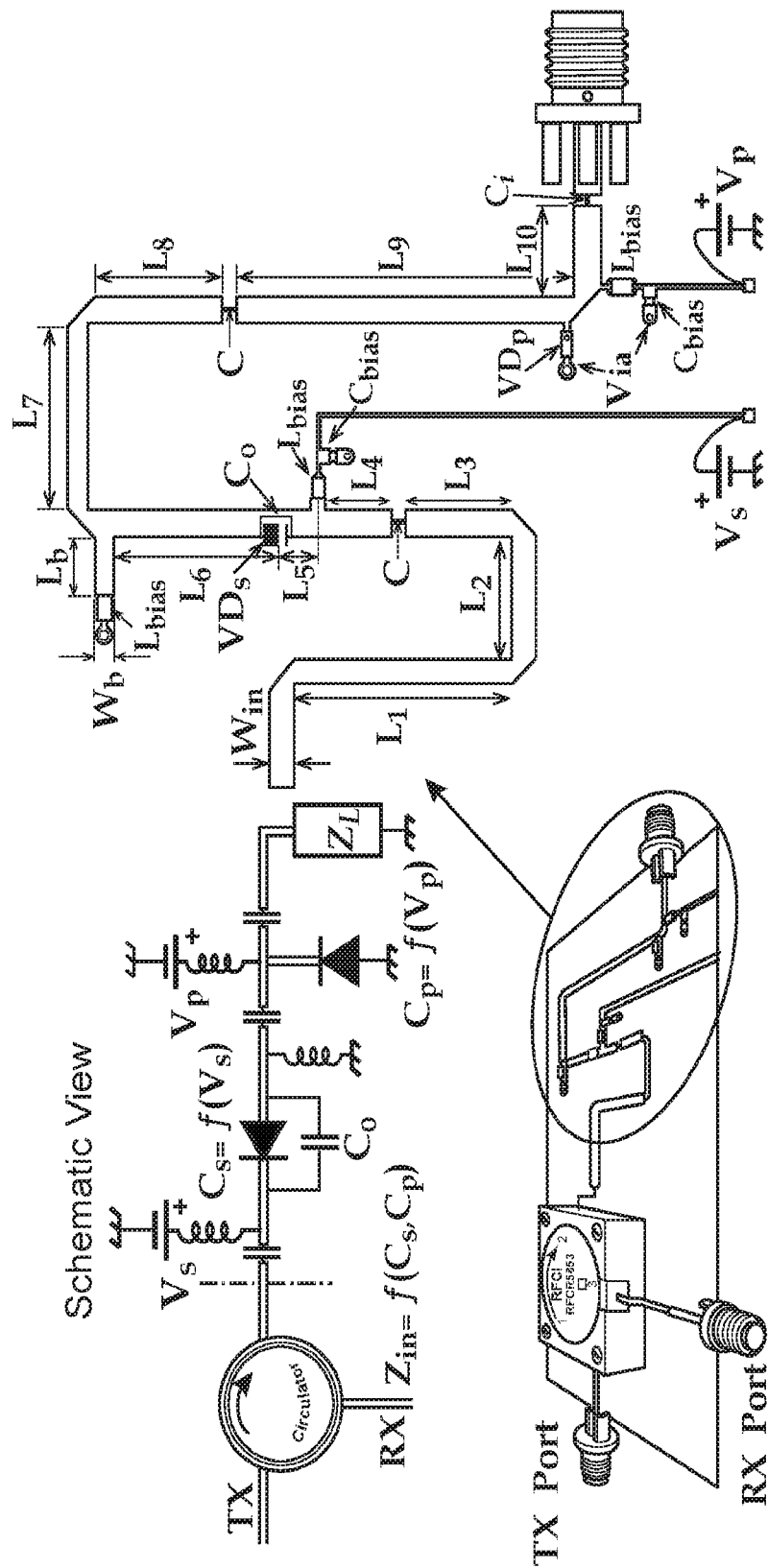
FIG. 13 illustrates the IMT circuit layout of FIG. 4 connected to a circulator, in accordance with an example.

The inherent SIC techniques described herein are extendable to all frequency bands. As an example following the same inherent SIC technique, we built the IMT circuit at 900 MHz frequency band, shown in FIG. 13. For the layout in FIG. 13, the parameter values in mm were: $L_1=16$, $L_2=8$, $L_3=8$, $L_4=5$, $L_5=1.65$, $L_6=10.8$, $L_7=12.5$, $L_8=10$, $L_9=25$, $L_{10}=5$, $L_b=4.2$, $W_{in}=1.8$, $C_{bias}=10$ μF, $L_{bias}=330$ nH, $C_0=33$ pF, $C_i=100$ pF, $C=12$ pF, with a substrate with $\epsilon_r=3$ and $h=0.762$ mm.

It should be noted that for different frequency band prototypes, the proper varactor diodes should be chosen that provide the desired series and parallel capacitance range. However an alternative option could be to parallelize the varactor diodes with a fixed capacitor to change the capacitance range. For 900 MHz prototype, we used varactor diodes with part number SMV1281 and SMV2019 from Skyworks as series and parallel varactor diodes, respectively. We also used a circulator with part number CR5353 from RF Circulator Isolator.

Figure 14:
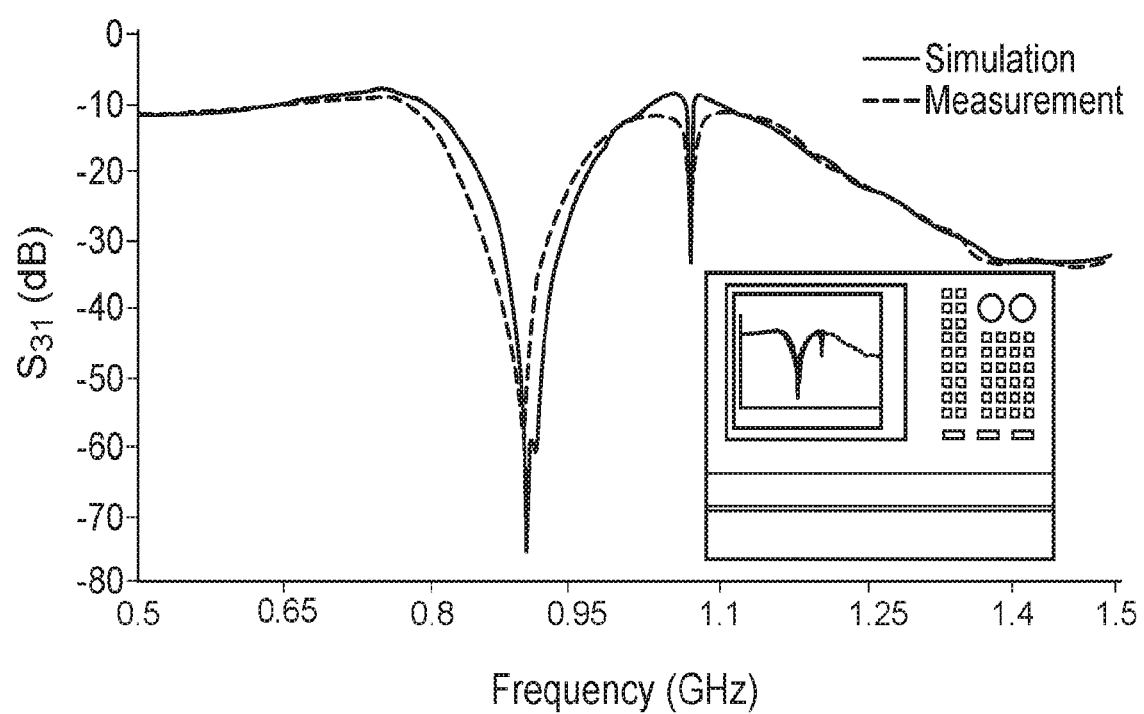
FIG. 14 is a graph of both simulated and measured inherent self-interference cancellation (SIC), in accordance with an example.

FIG. 14 shows the amount of SI cancellation achieved in 900 MHz frequency band, with the inherent SIC technique in this example. Note that here we used a 50Ω load as the input impedance of antenna. 40 dB SI cancellation over 35 MHz frequency bandwidth has been achieved for $V_S=1$ V and $V_P=4.5$ V as DC voltage bias of series and parallel varactor diodes, respectively. The SI cancellation will vary with the bandwidth.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives.

For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

This detailed description is to be construed as providing examples only and does not describe every possible embodiment, as describing every possible embodiment would be impractical, if not impossible. One could implement numerous alternate embodiments, using either current technology or technology developed after the filing date of this application.

The foregoing description is given for clearness of understanding; and no unnecessary limitations should be understood therefrom, as modifications within the scope of the invention may be apparent to those having ordinary skill in the art.

What is claimed is:

1. A method for self-interference cancellation, the method comprising:
    providing an In-Band Full-Duplex (IBFD) system comprising: (i) a single antenna, and (ii) a circulator having at least a transmitter port, a receiver port, and an impedance mismatch terminal (IMT) port,
    the IBFD system further comprising a transmitter connected to the transmitter port, a receiver connected to the receiver port, and an IMT circuit, the IMT circuit: (i) connected to the IMT port, (ii) operating between the antenna and the circulator, and (iii) comprising a varactor diode configured in parallel to the circulator; and
    configuring the IMT circuit to collect a secondary self-interference signal of the circulator and to manipulate the phase and angle of the secondary self-interference signal.

2. The method of claim 1, further comprising configuring the IMT circuit to, in response to manipulating the phase and angle of the second self-interference signal, adjust and cancel a primary self-interference signal leaked from the transmitter port.

3. The method of claim 1, further comprising transmitting signals and receiving signals using the single antenna of the IBFD system.

4. The method of claim 1, wherein the IMT circuit further comprises an additional varactor diode.

5. The method of claim 1, wherein the IMT circuit is adjustable.

6. The method of claim 1, further comprising:
    tapping a transmission signal using the IMT circuit to generate a tapped transmission signal; and
    modifying an amplitude and phase of the tapped transmission signal to produce a modified tapped transmission signal having the same amplitude and a 180° phase shift from the primary self-interference signal, and adding the modified tapped transmission signal as a cancellation signal to a receiving channel.

7. The method of claim 6, further comprising adding the cancellation signal to the receiving channel using the circulator.

8. A single-antenna In-Band Full-Duplex system comprising:
    an antenna;
    a circulator having at least a transmitter port, a receiver port, and an impedance mismatch terminal (IMT) port;
    a transmitter connected to the transmitter port;
    a receiver connected to the receiver port; and
    an IMT circuit: (i) connected to the IMT port, (ii) operatively coupled between the antenna and the circulator, and (iii) comprising a varactor diode configured in parallel to the circulator;
    wherein the transmitter and receiver are configured to operate on the same wavelength; and
    wherein the IMT circuit is configured to modify the magnitude and phase of a secondary self-interference signal to cancel a primary self-interference signal leaked from the transmitter port.

9. The single-antenna In-Band Full-Duplex system of claim 8, wherein the IMT circuit further comprises an additional varactor diode.

10. The single-antenna In-Band Full-Duplex system of claim 9, wherein the additional varactor diode is configured in series with the circulator.

11. The single-antenna In-Band Full-Duplex system of claim 8, wherein the IMT circuit is adjustable.

12. The single-antenna In-Band Full-Duplex system of claim 8, wherein the IMT circuit is configured to tap a transmission signal, to modify the amplitude and phase of the tapped transmission signal to generate a modified transmission signal that has the same amplitude and a 180° phase shift from a primary self-interference signal, and to add the modified transmission signal to a receiving channel of the single-antenna In-Band Full-Duplex system.

13. A method for increasing usable capacity of an electromagnetic spectrum for a communication device, the method comprising:
    establishing a transmitting channel between a transmitter and a single antenna in an In-Band Full-Duplex system, the transmitting channel including a circulator operatively coupled to the transmitter and to the single antenna;
    establishing a receiving channel between a receiver and the single antenna, the receiving channel including the circulator, the circulator operatively coupled to the receiver; and
    operating an impedance mismatch terminal (IMT) circuit between the circulator and the single antenna to collect a secondary self-interference signal of the circulator and to manipulate a phase and angle of the secondary self-interference signal to cancel at least a portion of a primary self-interference signal leaked from a transmitter port of the transmitter, wherein cancellation of the at least a portion of the primary self-interference signal increases the usable capacity of the electromagnetic spectrum of the In-Band Full-Duplex system;
    wherein the IMT circuit comprises a varactor diode configured in parallel to the circulator.

14. The method of claim 13, wherein the IMT circuit further comprises an additional varactor diode, the method further comprising applying DC voltage biases to both the varactor diode and the additional varactor diode to eliminate input impedance variations.

15. The method of claim 13, further comprising:
tapping a transmission signal on the transmitting channel;
modifying an amplitude and phase of the tapped transmission signal to generate a modified transmission signal having the same amplitude and a 180° phase shift from the primary self-interference signal; and
adding the modified transmission signal to the receiving channel to cancel the primary self-interference signal.

\* \* \* \* \*